United States Patent

Fukumizu et al.

(10) Patent No.: US 9,007,809 B2
(45) Date of Patent: Apr. 14, 2015

(54) SEMICONDUCTOR MEMORY DEVICE

(71) Applicant: Kabushiki Kaisha Toshiba, Tokyo (JP)

(72) Inventors: Hiroyuki Fukumizu, Yokohama (JP);
Shigeki Kobayashi, Kuwana (JP);
Yasuhiro Nojiri, Yokohama (JP);
Masaki Yamato, Yokkaichi (JP);
Takeshi Yamaguchi, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 74 days.

(21) Appl. No.: 13/778,762

(22) Filed: Feb. 27, 2013

(65) Prior Publication Data

US 2013/0301339 A1 Nov. 14, 2013

(30) Foreign Application Priority Data

May 9, 2012 (JP) .................... 2012-107276

(51) Int. Cl.
*G11C 13/00* (2006.01)
*H01L 45/00* (2006.01)
*H01L 27/24* (2006.01)

(52) U.S. Cl.
CPC ........ *G11C 13/0002* (2013.01); *G11C 13/0007* (2013.01); *G11C 13/0069* (2013.01); *H01L 45/04* (2013.01); *G11C 2013/0073* (2013.01); *G11C 2013/0083* (2013.01); *G11C 2213/52* (2013.01); *G11C 2213/71* (2013.01); *G11C 2213/72* (2013.01); *H01L 45/12* (2013.01); *H01L 45/1233* (2013.01); *H01L 45/1253* (2013.01); *H01L 45/146* (2013.01); *H01L 27/2409* (2013.01); *H01L 27/2481* (2013.01)

(58) Field of Classification Search
None
See application file for complete search history.

(56) References Cited

U.S. PATENT DOCUMENTS

| | | | | |
|---|---|---|---|---|
| 2009/0272962 | A1* | 11/2009 | Kumar et al. | 257/4 |
| 2010/0208509 | A1* | 8/2010 | Maejima | 365/148 |
| 2010/0258781 | A1 | 10/2010 | Phatak et al. | |
| 2010/0258782 | A1 | 10/2010 | Kuse et al. | |
| 2011/0068314 | A1 | 3/2011 | Takahashi et al. | |
| 2011/0070713 | A1 | 3/2011 | Nansei | |
| 2013/0026438 | A1* | 1/2013 | Wang et al. | 257/4 |
| 2013/0235646 | A1* | 9/2013 | Nojiri et al. | 365/148 |

FOREIGN PATENT DOCUMENTS

| | | |
|---|---|---|
| JP | 2011-29462 | 2/2011 |
| JP | 2011-60896 | 3/2011 |

(Continued)

OTHER PUBLICATIONS

U.S. Appl. No. 13/601,494, filed Aug. 31, 2012, Hiroyuki Fukumizu, et al.

(Continued)

*Primary Examiner* — James G Norman
(74) *Attorney, Agent, or Firm* — Oblon, McClelland, Maier & Neustadt, L.L.P.

(57) ABSTRACT

A control circuit controls a voltage applied to a memory cell array. A first electrode contacts to a first surface of a variable resistance element, while a second electrode contacts to a second surface of the variable resistance element. The first electrode is configured by a metal, and the second electrode is configured by a P type semiconductor. The control unit, when performing a setting operation of a memory cell, applies a voltage such that a current flows in a direction from the first electrode toward the second electrode.

17 Claims, 9 Drawing Sheets

(56) References Cited

FOREIGN PATENT DOCUMENTS

| | | |
|---|---|---|
| JP | 2011-71167 | 4/2011 |
| JP | 2011-71226 | 4/2011 |

OTHER PUBLICATIONS

U.S. Appl. No. 13/601,040, filed Aug. 31, 2012, Katsuyuki Sekine, et al.

* cited by examiner

SEMICONDUCTOR MEMORY DEVICE

CROSS REFERENCE TO RELATED APPLICATIONS

This application is based on and claims the benefit of priority from prior Japanese Patent Application No. 2012-107276, filed on May 9, 2012, the entire contents of which are incorporated herein by reference.

FIELD

Embodiments described in the present specification relate to a semiconductor memory device.

BACKGROUND

In recent years, along with an increasing degree of integration of semiconductor devices, circuit patterns of transistors and so on configuring these semiconductor devices have become increasingly miniaturized. In order to achieve this shrinking of patterns, it is important not only simply to narrow line width, but also to improve dimensional accuracy, positional accuracy, and so on, of patterns.

Conventionally known and market-released semiconductor memory devices such as DRAM, SRAM, and flash memory have all used a MOSFET as a memory cell. Therefore, along with shrinking of patterns, a large burden has also been placed on lithography technology for forming these patterns, which has been a major cause of a rise in product costs.

In recent years, resistance varying memory has been receiving attention as a successor candidate of such semiconductor memory devices employing a MOSFET as a memory cell. Such a resistance varying memory has advantages that a cross-point type cell structure in which memory cells are formed at intersections of intersecting bit lines and word lines can be adopted, making shrink easy compared to conventional memory cells, and also a stacking structure can be configured in a perpendicular direction, making it easy to improve a degree of integration of a memory cell array.

A write operation (setting operation) of data to a resistance varying memory of so-called bipolar type is performed by applying to a variable resistance element a setting voltage of a first polarity. This causes the variable resistance element to change from a high-resistance state to a low-resistance state. On the other hand, an erase operation (resetting operation) of data is performed by applying to a variable resistance element in a low-resistance state after a setting operation a resetting voltage of a second polarity which is opposite to the first polarity applied during the setting operation. This causes the variable resistance element to change from a low-resistance state to a high-resistance state. Moreover, in a resistance varying memory of unipolar type, polarities of the setting voltage and the resetting voltage are the same, and application times or voltage values of those setting and resetting voltages are set to different values.

When performing this kind of setting operation or a forming operation (an operation to render a memory cell in a state of being transition-capable between a high-resistance state and a low-resistance state), it is important to appropriately control a cell current flowing in a variable resistance element, not only from a viewpoint of reduction in voltage consumption, but also from a viewpoint of securing stable operation.

DETAILED DESCRIPTION

A semiconductor memory device in an embodiment described below comprises a memory cell array configured having memory cells arranged therein, each of the memory cells being disposed between a first line and a second line and including a variable resistance element. A control unit controls a voltage applied to the memory cell array. A first electrode contacts to a first surface of the variable resistance element, while a second electrode contacts to a second surface of the variable resistance element. The first electrode is configured by a metal, and the second electrode is configured by a P type semiconductor. The control unit, when performing a setting operation of the memory cells, applies a voltage such that a current flows in a direction from the first electrode toward the second electrode. It is also possible for the first electrode to be configured by a metal, and the second electrode to be configured by an N type semiconductor. In this case, the control unit, when performing a setting operation, applies a voltage such that a current flows in a direction from the second electrode toward the first electrode.

Next, embodiments are described in detail with reference to the drawings.

First Embodiment

Figure 1:
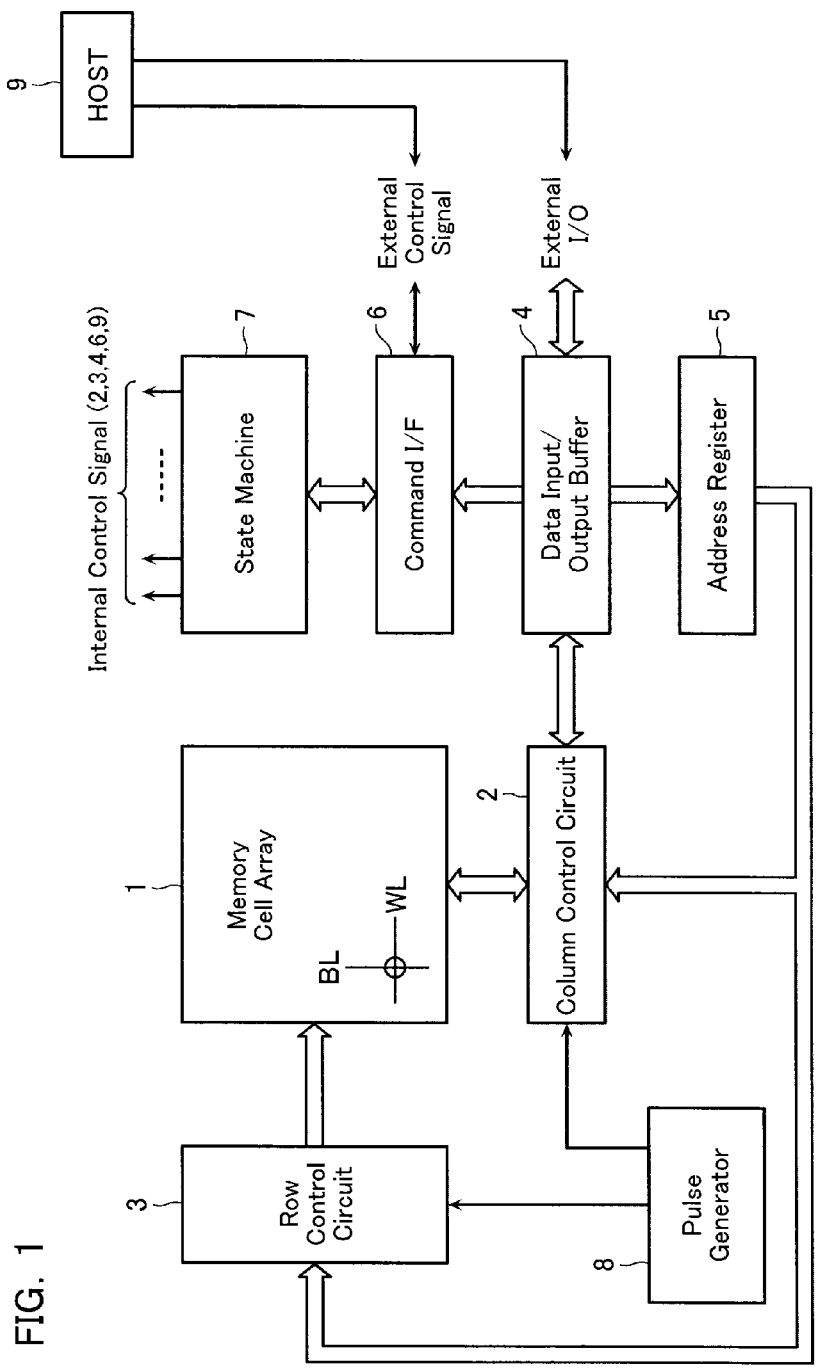
FIG. 1 is an example of a block diagram of a nonvolatile semiconductor memory device according to an embodiment.

FIG. 1 is an example of a block diagram of a nonvolatile memory according to a first embodiment.

This nonvolatile memory comprises a memory cell array 1 having memory cells arranged in a matrix therein, each of the memory cells utilizing a variable resistance element to be described later.

Provided at a position adjacent in a bit line BL direction of the memory cell array 1 is a column control circuit 2 that controls bit lines BL of the memory cell array 1 and applies voltages required in data erase of the memory cells, data write to the memory cells, and data read from the memory cells.

Moreover, provided at a position adjacent in a word line WL direction of the memory cell array 1 is a row control circuit 3 that selects word lines WL of the memory cell array 1 and applies voltages required in data erase of the memory cells, data write to the memory cells, and data read from the memory cells.

A data input/output buffer 4 is connected to an external host 9 via an I/O line to receive write data, receive erase commands, output read data, and receive address data and command data.

The data input/output buffer 4 sends write data received from the host 9 to the column control circuit 2, and receives data read from the column control circuit 2 to be outputted to external. Addresses supplied to the data input/output buffer 4 from external are sent to the column control circuit 2 and the row control circuit 3 via an address register 5.

In addition, commands supplied to the data input/output buffer 4 from the host 9 are sent to a command interface 6. The command interface 6 receives external control signals from the host 9, judges whether data inputted to the data input/output buffer 4 is write data or a command or an address, and if a command, receives the data and transfers the data to a state machine 7 as a command signal.

The state machine 7 performs management of this nonvolatile memory overall, receiving commands from the host 9 via the command interface 6, and performing read, write, erase, management of input/output of data, and so on. In addition, status information managed by the state machine 7 can also be received by the external host 9, whereby the external host 9 can judge an operation result. Moreover, this status information is utilized also in control of write and erase. Furthermore, the state machine 7 controls a pulse generator 8. This control enables the pulse generator 8 to output a pulse of any voltage and any timing.

Now, the pulse formed by the pulse generator 8 can be transferred to any line selected by the column control circuit 2 and the row control circuit 3. Note that elements of peripheral circuits other than the memory cell array 1 can be formed in a Si substrate directly below the memory cell array 1 formed in a wiring layer, whereby chip area of this nonvolatile memory can be made substantially equal to area of the memory cell array 1.

Figure 2:
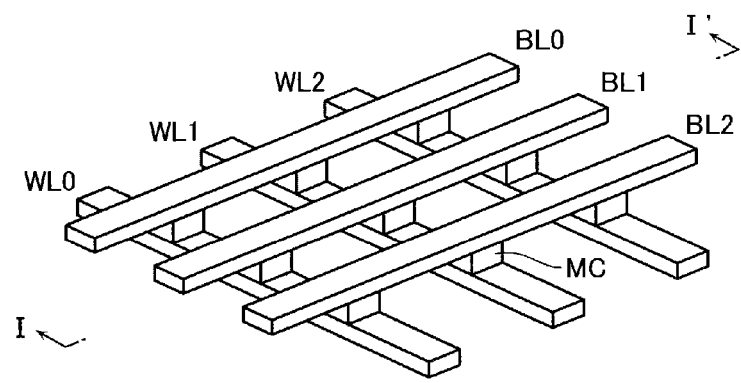
FIG. 2 is an example of a perspective view of part of a memory cell array 1.
Figure 3:
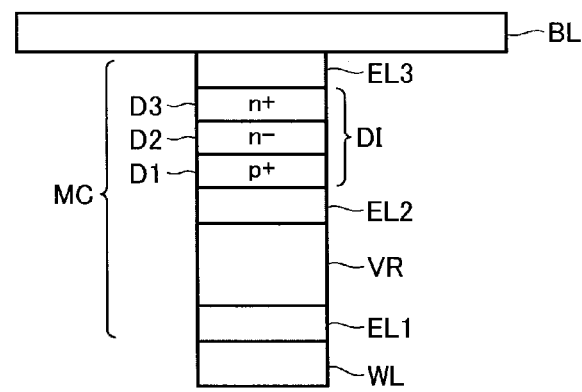
FIG. 3 is an example of a cross-sectional view taken along the line I-I' and looking in the direction of the arrows in FIG. 2, showing a single memory cell portion.

FIG. 2 is an example of a perspective view of part of the memory cell array 1, and FIG. 3 is an example of a cross-sectional view taken along the line I-I' and looking in the direction of the arrows in FIG. 2, showing a single memory cell portion. Word lines WL0~WL2 acting as a plurality of first lines are arranged in parallel, bit lines BL0~BL2 acting as a plurality of second lines are arranged in parallel intersecting these word lines WL0~WL2, and memory cells MC are disposed at each of intersections of these word lines and bit lines to be sandwiched by both lines. The first and second lines are desirably made of a material that is heat resistant and has a low resistance value. For example, the likes of W, WSi, NiSi, and CoSi can be employed as the material.

As shown in FIG. 3, the memory cell MC is configured from a series-connected circuit of a variable resistance element VR and a diode DI (bidirectional diode). As shown in FIG. 3, the diode DI is configured from a PIN diode comprising a p+ type layer D1, an n-type layer D2, and an n+ type layer D3, as an example. Here, the symbols "+" and "−" indicate magnitude of impurity concentration. The variable resistance element VR is configured from for example a thin film of an oxide of a transition metal (for example, hafnium oxide (HfOx)). Besides employing hafnium oxide, it is also possible to employ oxides of other transition metals (chromium (Cr), tungsten (W), vanadium(V), niobium(Nb), tantalum(Ta), titanium(Ti), zirconium (Zr), scandium (Sc), yttrium (Y), thorium (Tr), cobalt (Co), nickel (Ni), copper (Cu), zinc (Zn), cadmium (Cd), aluminum (Al), gallium (Ga), tin (Sn), lead (Pb), antimony (Sb), and bismuth (Si)). Moreover, oxides of rare earth elements from lanthanum (La) to lutetium (Lu) may also be employed. However, when hafnium oxide is adopted as the material of the variable resistance element VR, values of a forming voltage Vform or a setting voltage Vset can be reduced compared to when for example titanium oxide (TiOx) or aluminum oxide (Al2O3) is employed as the material of the variable resistance element VR. Moreover, if nitrogen (N) is included in the hafnium oxide, values of the forming voltage Vform or the setting voltage Vset can be further reduced.

A first electrode EL1 and a second electrode EL2 are disposed on upper and lower surfaces of this variable resistance element VR. The first electrode EL1 and the second electrode EL2 function as an adhesion layer and a barrier metal to the variable resistance element.

In addition, a third electrode EL3 functioning as a barrier metal and an adhesion layer is formed between the diode DI and the word line WL. As shown in FIG. 3, the memory cell MC is configured from a series-connected circuit of a variable resistance element VR and a diode DI.

The following are employed as a material of the electrodes EL2 and EL3, namely, Pt, Au, Ag, TiAlN, SrRuO, Ru, RuN, Ir, Co, Ti, TiN, TaN, LaNiO, Al, PtIrOx, PtRhOx, Rh/TaAlN, W, and the like. Moreover, the electrode EL1 differs from the electrodes EL2 and EL3 in employing N type polysilicon.

Figure 4:
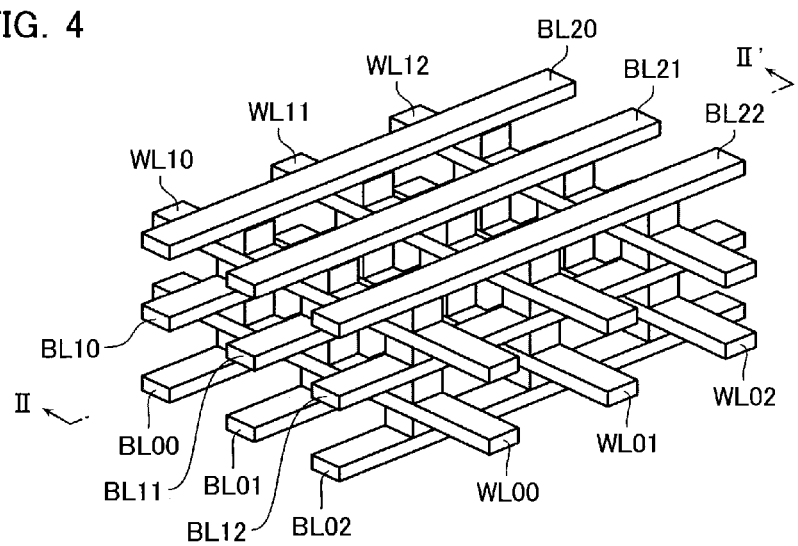
FIG. 4 shows a separate example of configuration of the memory cell array 1.
Figure 5:
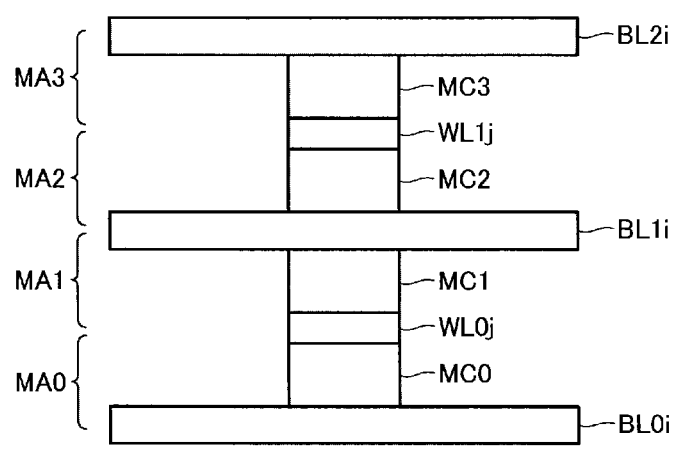
FIG. 5 shows a separate example of configuration of the memory cell array 1.

In addition, as shown in FIG. 4, a three-dimensional structure having the above-described memory structure multiply stacked may also be adopted. FIG. 5 is a an example of cross-sectional view showing a cross-section taken along the line II-II' in FIG. 4. The example illustrated is a memory cell array having a four layer structure configured from cell array layers MA0~MA3. Word line WL0$j$ is shared by memory cells MC0 and MC1 below and above word line WL0$j$, bit line BL1i is shared by memory cells MC1 and MC2 below and above bit line BL1i, and word line WL1$j$ is shared by memory cells MC2 and MC3 below and above word line WL1$j$.

Moreover, a configuration interposing an interlayer insulating film between cell array layers such as line/cell/line/interlayer-insulating-layer/line/cell/line may also be adopted rather than this repetition of line/cell/line/cell. Note that the memory cell array 1 may also be divided into several MATs of memory cell groups. The previously mentioned column control circuit 2 and row control circuit 3 may be provided to each MAT, each sector, or each cell array layer MA, or may be shared by these. Moreover, these control circuits may also be shared by a plurality of bit lines BL for reduction of area.

Figure 6:
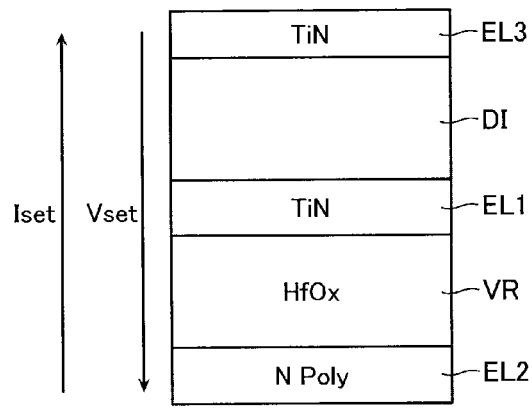
FIG. 6 is a cross-sectional view showing a structure of a memory cell MC in a first embodiment.

FIG. 6 is an example of a schematic view showing a cross-sectional shape of the memory cell in the first embodiment. As previously mentioned, in the present embodiment, the electrodes EL1 and EL3 employ a metal electrode such as titanium nitride (TiN), while the electrode EL2 employs N type polysilicon. When N type polysilicon is employed as a material of the electrode EL2, a current Isetaf flowing in the memory cell MC after completion of the setting operation (referred to below as "after-setting current Isetaf") can be lowered, and a current and voltage required in a subsequent resetting operation can also be reduced, compared to when a metal electrode is adopted for both the electrodes EL1 and EL2, with the result that power consumption of the memory device can be reduced.

Furthermore, in the present embodiment, in order to achieve a further reduction in the after-setting current Isetaf, voltage polarity of the setting voltage Vset is set as follows. That is, during the setting operation of the memory cell MC, the state machine 7 in the first embodiment applies to the memory cell MC, using the pulse generator 8, a setting voltage Vset so as to cause a setting current Iset to flow in a direction from the electrode EL2 toward the electrode EL1 (a setting voltage Vset such that a potential of the electrode EL2 becomes larger than a potential of the electrode EL1).

In this case, a voltage value of the setting voltage Vset is set to a higher value than when the electrodes EL1 and EL2 are both metal electrodes. However, the after-setting current Isetaf can be further lowered compared to when a setting voltage Vset that causes a setting current Iset to flow in a direction from the electrode EL1 toward the electrode EL2 is applied (a setting voltage Vset such that a potential of the electrode EL1 becomes larger than a potential of the electrode EL2 is applied). As a result, power consumption of the memory device can be reduced.

Figure 7:
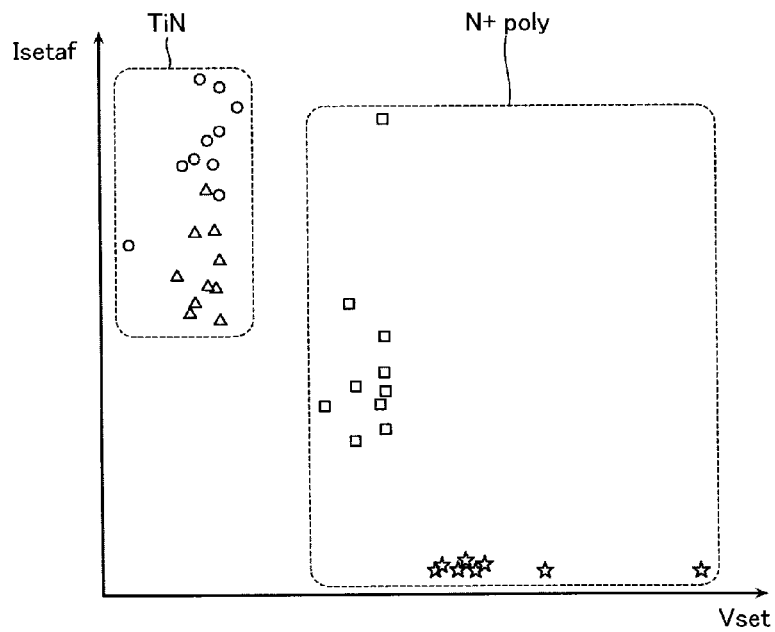
FIG. 7 is an example of a graph explaining advantages of the present embodiment.

FIG. 7 shows an example of a relationship between the setting voltage Vset and the after-setting current Isetaf in the case where the electrodes EL1 and EL2 are both formed by titanium nitride TiN which is a metal (circles and triangles). In addition, FIG. 7 shows a relationship between the setting voltage Vset and the after-setting current Isetaf in the case where the electrode EL1 is formed by titanium nitride TiN while the electrode EL2 is formed by N type polysilicon as in the present embodiment (squares and stars). Note that FIG. 7 is a result of analysis by a structure excluding the diode DI.

As shown in FIG. 7, when the electrodes EL1 and EL2 are both formed by titanium nitride TiN, the voltage value of the setting voltage Vset is substantially constant regardless of its polarity (In FIG. 7, circle marks indicate the case where the potential of the electrode EL2 is higher than that of the electrode EL1, while triangle marks indicate the case where the potential of the electrode EL1 is higher than that of the electrode EL2). The after-setting current Isetaf is large regardless of the polarity of the setting voltage Vset, and this is a cause of increase in power consumption.

On the other hand, when the electrode EL1 is formed by TiN while the electrode EL2 adopts N type polysilicon as its material, the value of the after-setting current Isetaf can be suppressed to a small value compared to when the electrodes EL1 and EL2 both adopt TiN as their materials, regardless of the polarity of the setting voltage Vset. Moreover, when the polarity of the setting voltage Vset is set such that a potential of the electrode EL2 side is large and a potential of the electrode EL1 side is small as described above, the after-setting current Isetaf can be further reduced, compared to the case when the polarity is the reverse of this (stars in FIG. 7). In FIG. 7, when the setting voltage Vset during the setting operation is given a polarity such that the setting current Iset flows in the direction from the electrode EL1 toward the electrode EL2, the after-setting current Isetaf attains a value which is of a degree that is slightly smaller than when the electrodes EL1 and EL2 are both formed by titanium nitride TiN (squares in FIG. 7). On the other hand, when the setting voltage Vset is given a polarity such that current flows in the direction from the electrode EL2 toward the electrode EL1 as in the first embodiment (FIG. 6), the after-setting current Isetaf can be suppressed to an extremely small value (stars in FIG. 7).

The fact that in such a way, when the electrode EL2 is formed by N type polysilicon, a current value of the after-setting current Isetaf differs significantly depending on the polarity of the setting voltage Vset is due to effects of a depletion layer. That is, when the electrode EL2 is formed by N type polysilicon and a setting voltage Vset is applied such that the potential of the electrode EL2 is larger than that of the electrode EL1, a depletion layer is generated at an interface between the variable resistance element VR and the electrode EL2 (HfOx/N type polysilicon interface). Such a depletion layer is not formed when the electrode EL2 is formed by metal.

In the memory cell structure of FIG. 6, when the setting voltage Vset is given a polarity such that current flows from the electrode EL2 toward the electrode EL1, electrons which are majority carriers in N type polysilicon configuring the electrode EL2 are drawn to a bit line BL side whereby a depletion layer is formed at the interface between the electrode EL2 and the variable resistance element VR.

Moreover, when the electrode EL2 is formed by N type polysilicon, a Schottky barrier is formed between the electrode EL2 and the bit line BL. This Schottky barrier also contributes to a reduction in the after-setting current Isetaf.

When the depletion layer is formed and moreover the Schottky barrier is formed, a voltage applied to the variable resistance element VR becomes smaller, and, as a result, the setting voltage Vset itself must be set to a higher value than when the electrodes EL1 and EL2 are both metal electrodes. However, due to the presence of such a depletion layer or Schottky barrier, transient current during the setting operation is suppressed and, as a result, the after-setting current Isetaf can be lowered. This causes power consumption to be reduced overall in spite of the rise in the setting voltage Vset.

In the memory cell structure of FIG. 6, when the setting voltage Vset is given a polarity such that current flows from the electrode EL1 toward the electrode EL2, electrons which are majority carriers in N type polysilicon configuring the electrode EL2 are drawn to a side of hafnium oxide (HfOx) configuring the variable resistance element VR. Therefore, a depletion layer is not formed at the interface between the electrode EL2 and the variable resistance element VR. Moreover, the Schottky barrier between the electrode EL2 and the bit line BL becomes smaller. In such a way, the polarity of the setting voltage Vset results in a depletion layer being formed or not formed. It is for this reason that the after-setting current Isetaf differs greatly depending on the polarity of the setting voltage Vset.

Figure 8:
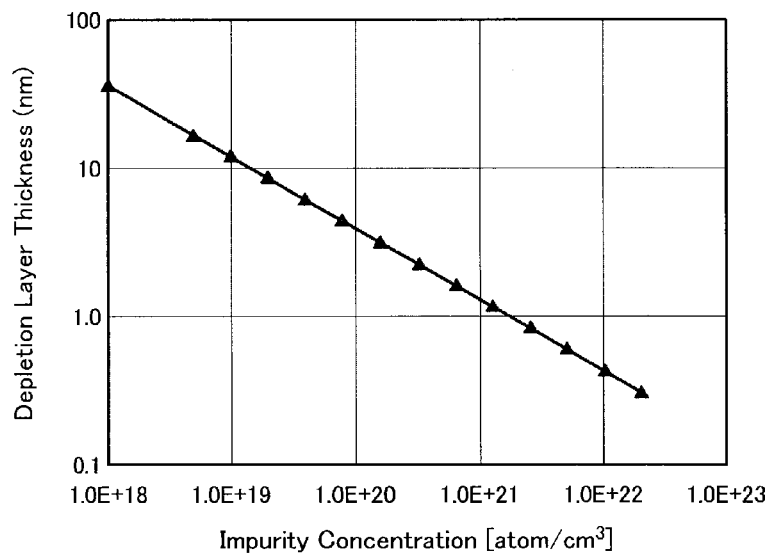
FIG. 8 is an example of a graph explaining a relationship between impurity concentration and depletion layer thickness of N type polysilicon in an electrode EL1.

Note that as shown in FIG. 8, the smaller an impurity concentration (for example, phosphorus (P)) in the N type silicon in the electrode EL2 becomes, the larger a thickness of the depletion layer becomes. When the thickness of the depletion layer increases, a transient current suppression effect increases to a degree proportionate to that increase. The impurity concentration of N type polysilicon can be set according to a required value of the after-setting current Isetaf.

Note that a transient current suppression effect can be obtained also by for example changing the material of the electrodes EL1 and EL3 to a metal of higher resistivity (for example, changing TiN to WSi). However, in this case, even though the transient current during the setting operation can be reduced, a series resistance component of the memory cell increases, hence both the setting voltage during the setting operation and the resetting voltage during the resetting operation increase, with the result that, contrarily, power consumption overall ends up being increased. On the other hand, the present embodiment causes the depletion layer to be formed only in the case where the voltage is given a polarity such that current flows in a direction from the electrode EL2 toward the electrode EL1, and does not cause a depletion layer to be formed in the opposite case. Therefore, a large voltage application is used only in one of either the setting operation and the resetting operation. In this respect, when the material of the electrodes EL1 and EL3 is made high resistance, the resistance value rises regardless of a direction of voltage application, hence a large voltage application becomes necessary in the cases of both the setting operation and the resetting operation. Therefore, the present embodiment enables the after-setting current Isetaf to be suppressed while suppressing either of the setting voltage or the resetting voltage to a low value, hence allows reduction of power consumption in the memory device overall to be achieved.

Note that the setting voltage Vset during the setting operation and the resetting voltage Vreset during the resetting operation need only be of reverse polarity to each other, and either polarity of voltage may be matched to a forward direction of the diode DI. However, a larger current is required during the resetting operation, hence it is preferable to match the polarity of the resetting voltage Vreset to the forward direction of the diode DI.

Moreover, when the electrode EL1 is formed by a metal while the electrode EL2 is formed by N type polysilicon, data retention characteristics of the memory cells MC can be improved compared to when both electrodes are made from a metal.

Figure 9:
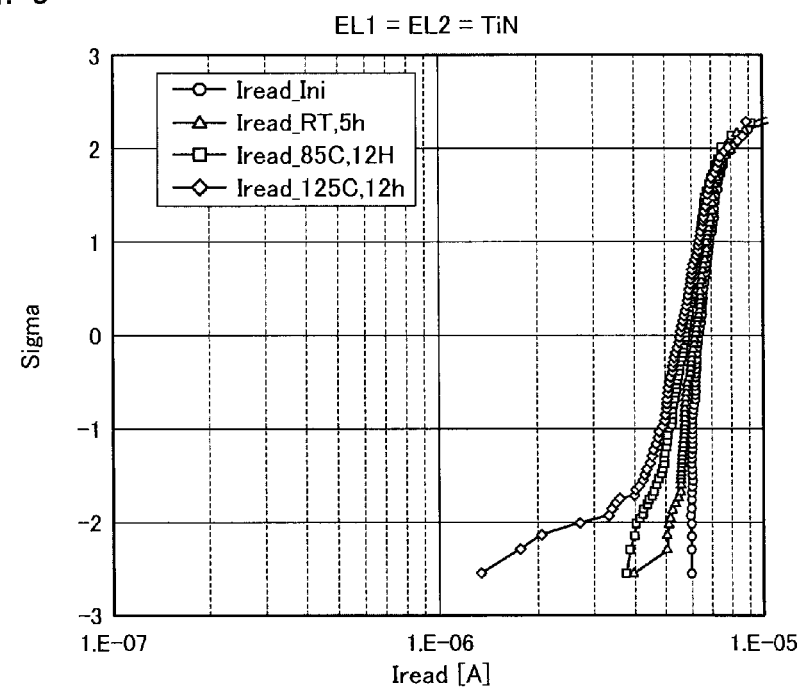
FIG. 9 is an example of a graph explaining advantages of the present embodiment.

FIG. 9 is an example of a measurement result of data retention characteristics in the case where both of the electrodes EL1 and EL2 are formed by a metal, for example, titanium nitride (TiN). In FIG. 9, values of a read current Iread in the case of a read operation being executed: (1) immediately after a setting operation; (2) after five hours have elapsed; (3) after 12 hours have elapsed at an ambient temperature of 85° C.; and (4) after 12 hours have elapsed at an ambient temperature of 125° C., respectively, are plotted. Values of various kinds of voltages are set such that the read current Iread attains a value of about 6 µA. It can be understood that in the case where both of the electrodes EL1 and EL2 are formed by titanium nitride (TiN), the value of the read current Iread changes (lowers) greatly due to passage of time.

Figure 10:
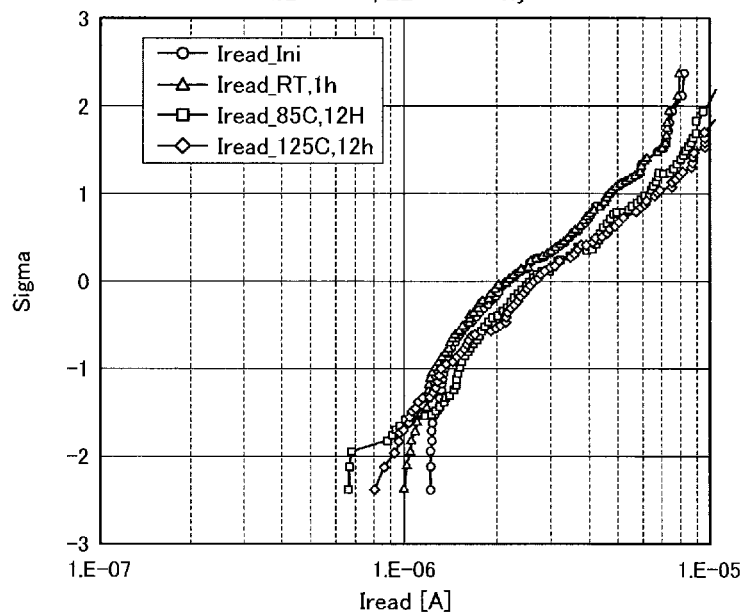
FIG. 10 is an example of a graph explaining advantages of the present embodiment.

FIG. 10 is an example of a measurement result of data retention characteristics in the case where the electrode EL2 is formed by N type polysilicon and the electrode EL1 is formed by a metal, for example, titanium nitride (TiN). Similarly to the case of FIG. 9, values of a read current Iread in the case of a read operation being executed: (1) immediately after a setting operation; (2) after five hours have elapsed; (3) after 12 hours have elapsed at an ambient temperature of 85° C.; and (4) after 12 hours have elapsed at an ambient temperature of 125° C., respectively, are plotted.

Values of various kinds of voltages are set such that the read current Iread attains a value of about 1.5 µA. It can be understood that in the case where the electrode EL2 is formed by N type polysilicon, variation in the read current Iread due to passage of time is reduced compared to the case of FIG. 9. That is, data retention characteristics are improved.

As is clear from the above, employing N type polysilicon as the material of the electrode EL2 allows data retention characteristics to be improved compared to the case where a metal is employed in the electrode EL2.

Moreover, the electrode EL1 is formed by a metal, for example, TiN. Besides TiN, the following various other materials may also be employed, for example, chromium (Cr), tungsten (W), niobium (Nb), tantalum (Ta), copper (Cu), and so on. At this time, it is preferable to employ a metal having small Gibbs free energy from the viewpoint of reducing resistivity of the memory cell MC and reducing power consumption. This is because if a metal having large Gibbs free energy is employed as the material of the electrode EL1, an oxide film becomes easily formed between the electrode EL1 and hafnium oxide forming the variable resistance element, and this becomes a cause of a rise in resistivity.

Figure 11:
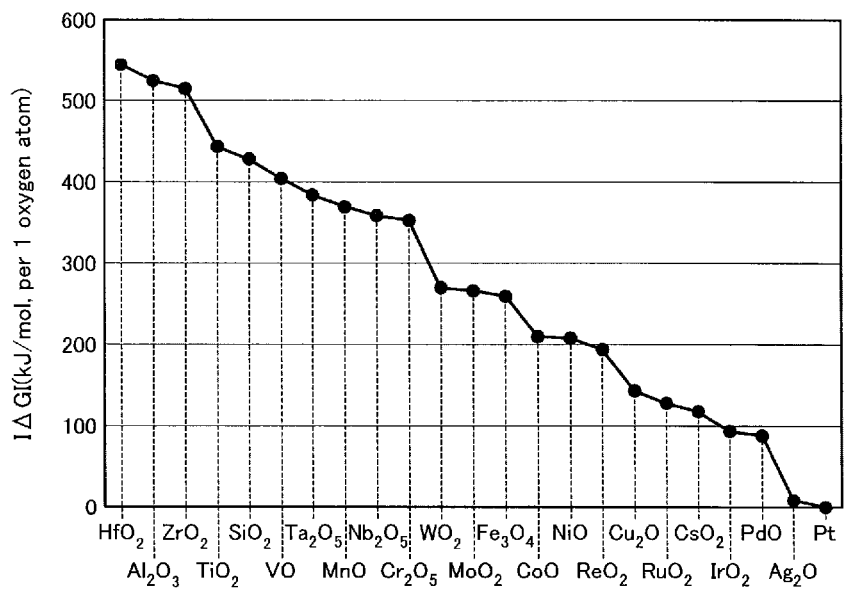
FIG. 11 is an example of a graph explaining advantages of the present embodiment.

FIG. 11 is an example of a graph of Gibbs free energy of various kinds of metal atoms converted to per one (oxygen) atom. As shown in FIG. 11, titanium (Ti) is comparatively easily oxidized, and the further a substance is to the right side of the graph, the more difficult it is to be oxidized.

Advantages of First Embodiment

As described above, the configuration of the first embodiment enables the after-setting current after completion of the setting operation to be reduced, and enables the voltage and current during the resetting operation also to be reduced, whereby power consumption can be reduced.

Second Embodiment

Figure 12:
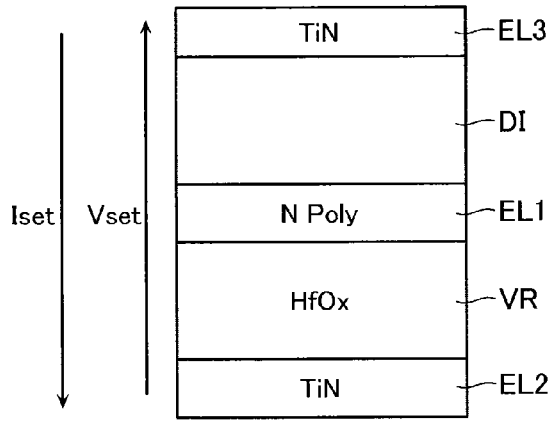
FIG. 12 is an example of a cross-sectional view showing a structure of a memory cell MC in a second embodiment.

FIG. 12 is an example of a schematic view showing a cross-sectional structure of a memory cell MC in a nonvolatile memory according to a second embodiment. The overall structure of this embodiment is identical to that of the first embodiment (FIGS. 1~5), but the structure of the memory cell MC and control in the state machine 7 are different to those of the first embodiment.

In this second embodiment, the electrodes EL2 and EL3 employ metal electrodes of titanium nitride (TiN) or the like, while the electrode EL1 employs N type polysilicon. Moreover, during the setting operation of the memory cell MC, the state machine 7 applies to the memory cell MC, using the pulse generator 8, the setting voltage Vset such that the setting current Iset flows in the direction from the electrode EL1 toward the electrode EL2. The fact that the electrode formed by N type polysilicon (EL1) is applied with a larger potential than the electrode formed by a metal (EL2) is common in the first embodiment. Configuring in this way enables a current value of the after-setting current Isetaf flowing in the memory cell MC after completion of the setting operation to be lowered, and an after-resetting current after completion of the resetting operation to be reduced, with the result that power consumption of the memory device can be reduced.

Third Embodiment

Figure 13:
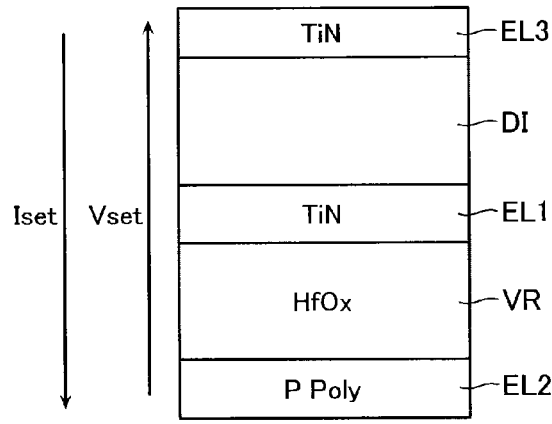
FIG. 13 is an example of a cross-sectional view showing a structure of a memory cell MC in a third embodiment.

FIG. 13 is an example of a schematic view showing a cross-sectional structure of a memory cell MC in a nonvolatile memory according to a third embodiment. The overall structure of this embodiment is identical to that of the first embodiment (FIGS. 1~5), but the structure of the memory cell MC and control in the state machine 7 are different to those of the first embodiment.

As previously mentioned, in the present embodiment, the electrodes EL1 and EL3 employ metal electrodes of titanium nitride (TiN) or the like, while the electrode EL2 employs P type polysilicon. This differs from the first and second embodiments where N type polysilicon was employed in the electrodes EL1 or EL2.

Moreover, during the setting operation of the memory cell MC, the state machine 7 applies to the memory cell MC, using the pulse generator 8, the setting voltage Vset such that the setting current Iset flows in the direction from the electrode EL1 toward the electrode EL2. Configuring in this way enables the after-setting current Isetaf flowing in the memory cell MC after completion of the setting operation to be lowered, with the result that power consumption of the memory device can be reduced.

Fourth Embodiment

Figure 14:
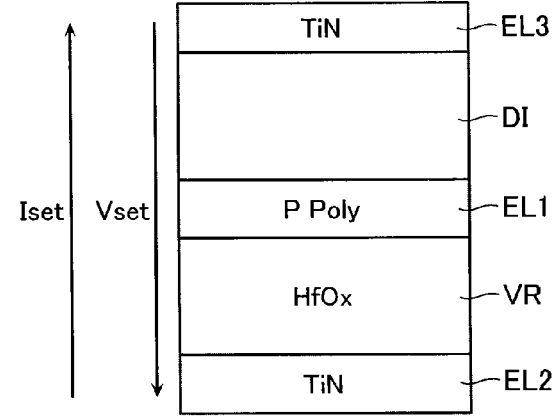
FIG. 14 is an example of a cross-sectional view showing a structure of a memory cell MC in a fourth embodiment.

FIG. 14 is an example of a schematic view showing a cross-sectional structure of a memory cell MC in a nonvolatile memory according to a fourth embodiment. The overall structure of this embodiment is identical to that of the first embodiment (FIGS. 1~5), but the structure of the memory cell MC and control in the state machine 7 are different to those of the first embodiment.

In this fourth embodiment, the electrodes EL2 and EL3 employ metal electrodes of titanium nitride (TiN) or the like, while the electrode EL1 employs P type polysilicon. Moreover, during the setting operation of the memory cell MC, the state machine 7 applies to the memory cell MC, using the pulse generator 8, the setting voltage Vset such that the setting current Iset flows in the direction from the electrode EL2 toward the electrode EL1. The fact that an electrode formed by P type polysilicon (EL1) is applied with a larger potential than the electrode formed by a metal (EL2) is common in the third embodiment. Configuring in this way enables a current value of the after-setting current Isetaf flowing in the memory cell MC after completion of the setting operation to be lowered, with the result that power consumption of the memory device can be reduced.

Fifth Embodiment

Figure 15:
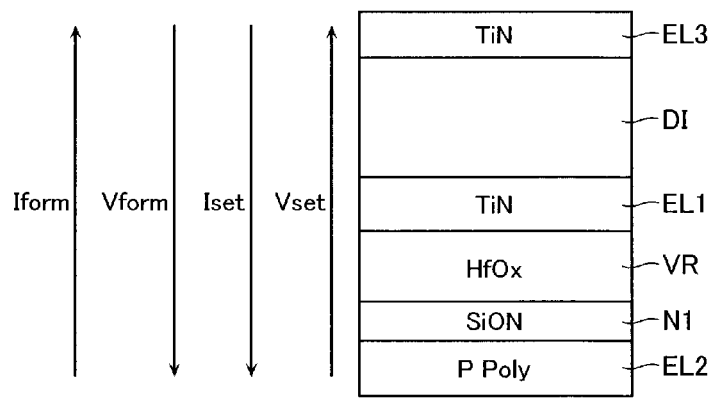
FIG. 15 is an example of a cross-sectional view showing a structure of a memory cell MC in a fifth embodiment.

FIG. 15 is an example of a schematic view showing a cross-sectional structure of a memory cell MC in a nonvolatile memory according to a fifth embodiment. The overall structure of this embodiment is identical to that of the first embodiment (FIGS. 1~5), but the structure of the memory cell MC and control in the state machine 7 are different to those of the first embodiment.

This fifth embodiment differs from the third embodiment (FIG. 13) in that an insulating layer N1 configured from SiON is inserted between the electrode EL2 configured from P type polysilicon and the variable resistance element VR. Note that SiN may be used as a material of the insulating layer N1, instead of SiON. That is, the material of the insulating layer N1 may be configured as a material including a Si—N bond. This configuration allows similar advantages to those of the third embodiment to be obtained, and, as described below, allows a forming voltage Vform to be lowered. Note that in the case of the configuration of FIG. 15, the forming voltage Vform is set to a polarity such as to cause a forming current Iform to flow in a direction from the electrode EL2 toward the electrode EL1 (a potential of the electrode EL2 is higher than a potential of the electrode EL1).

Figure 16A:
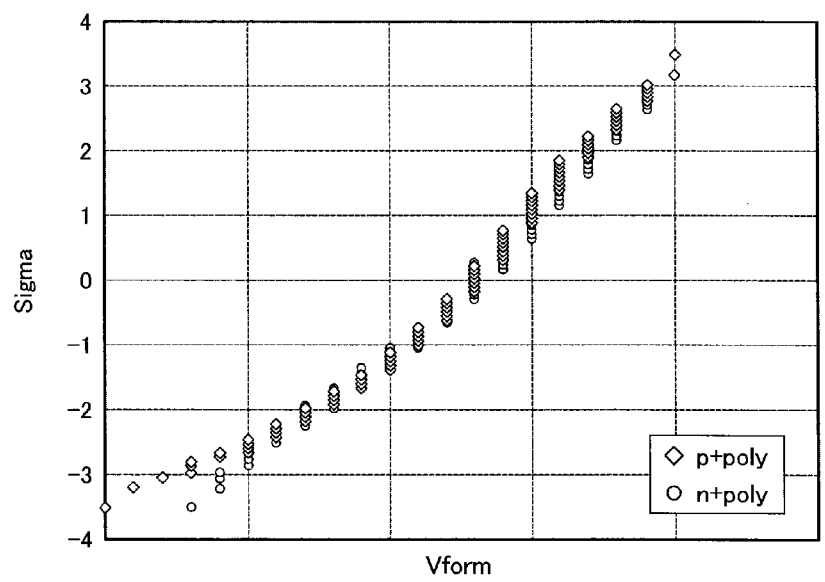
FIG. 16A is an example of a graph showing a setting current when a SiON film is not sandwiched between an electrode EL2 and a variable resistance element VR.
Figure 16B:
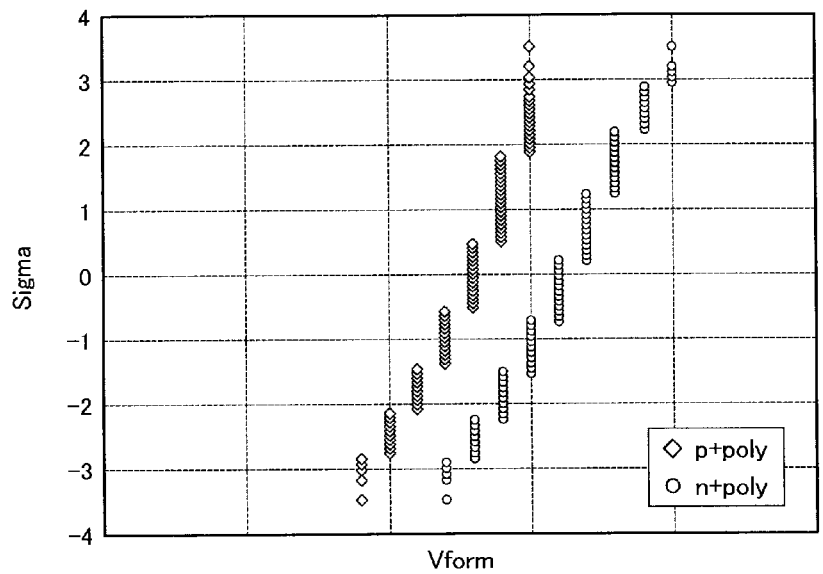
FIG. 16B is an example of a graph showing a setting current when a SiON film is sandwiched between an electrode EL2 and a variable resistance element VR.

FIGS. 16A and 16B represent an example of an experiment result showing that when the insulating layer N1 configured from SiON is inserted between the electrode EL2 configured from P type polysilicon and the variable resistance element VR, the forming voltage Vform can be significantly lowered.

FIG. 16A is a graph of the case where a film of SiON is not inserted between the electrode EL2 and the variable resistance element VR, and FIG. 16B is a graph of the case where a film of SiON is inserted between the electrode EL2 and the variable resistance element VR. The scale of the horizontal axis in both FIGS. 16A and 16B is matched.

As shown in FIG. 16A, when a film of SiON is not inserted between the electrode EL2 and the variable resistance element VR, there is no great difference in the forming voltage Vform between the case where the electrode EL2 is of P type polysilicon and the case where the electrode EL2 is of N type polysilicon.

On the other hand, as shown in FIG. 16B, when a film of SiON is formed between the electrode EL2 and the variable resistance element VR, a size of the forming voltage Vform can be more greatly reduced in the case where the electrode EL2 is of P type polysilicon than in the case where the electrode EL2 is of N type polysilicon.

Methods of forming the insulating layer N1 of SiON inserted between the electrode EL2 and the variable resistance element VR include the following, for example.
(i) a method of forming a film by ALD, CVD, or the like
(ii) thermal nitrization of Si
(iii) a method of plasma nitriding SiO2 formed by ALD, CVD, or the like These methods of film formation may also be changed in accordance with an order of film formation between the electrode EL2 and the variable resistance element VR.

Sixth Embodiment

Figure 17:
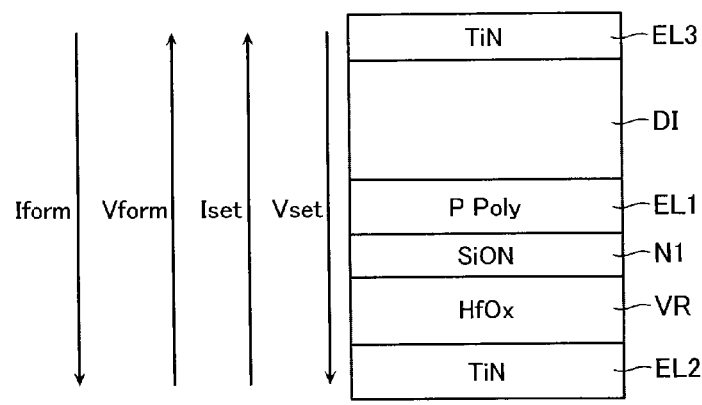
FIG. 17 is an example of a cross-sectional view showing a structure of a memory cell MC in a sixth embodiment.

FIG. 17 is an example of a schematic view showing a cross-sectional structure of a memory cell MC in a nonvolatile memory according to a sixth embodiment. The overall structure of this embodiment is identical to that of the first embodiment (FIGS. 1~5), but the structure of the memory cell MC and control in the state machine 7 are different to those of the first embodiment.

This sixth embodiment differs from the fourth embodiment (FIG. 14) in that an insulating layer N1 configured from SiON is inserted between the electrode EL1 configured from P type polysilicon and the variable resistance element VR. The fact that a film of SiON is formed between an electrode configured from P type polysilicon and the variable resistance element VR is common in the fifth embodiment. Therefore, the present embodiment can display similar advantages to those of the fifth embodiment. Note that in the case of the configuration of FIG. 17, the forming voltage Vform is set to a polarity such as to cause a forming current Iform to flow in a direction from the electrode EL1 toward the electrode EL2 (a potential of the electrode EL1 is higher than a potential of the electrode EL2).

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

For example, the above-described embodiments were explained taking the example of a memory device configured to perform bipolar operation in which polarity of voltage is reversed between the time of the setting operation and the time of the resetting operation. However, the present invention may also be applied to a memory device configured to perform unipolar operation. That is, adopting a configuration of a memory cell which is similar to that of the above-described embodiments, and adopting a setting voltage during the setting operation which is similar to that of the above-described embodiments, in a memory device of unipolar operation, allows the above-described advantages to be realized.

What is claimed is:

1. A semiconductor memory device, comprising:
a memory cell array configured having memory cells arranged therein, each of the memory cells being disposed between a first line and a second line and including a variable resistance element; and
a control unit configured to control a voltage applied to the memory cell array,
the memory cell includes:
a first electrode contacting to a first surface of the variable resistance element; and
a second electrode contacting to a second surface of the variable resistance element,
the first electrode being configured by a metal,
the second electrode being configured by an N type semiconductor, and
the control unit being configured to, when performing a setting operation of the memory cells, apply a voltage such that a current flows in a direction from the second electrode toward the first electrode.

2. The semiconductor memory device according to claim 1, wherein
the N type semiconductor is N type polysilicon.

3. The semiconductor memory device according to claim 1, wherein
the N type semiconductor is configured such that, a depletion layer is formed between the second electrode and the variable resistance element when a voltage is applied to the N type semiconductor so as to flow a current in the direction from the second electrode toward the first electrode.

4. The semiconductor memory device according to claim 1, wherein
the N type semiconductor is N type poysilicon, and
the N type semiconductor is configured such that a depletion layer is formed between the second electrode and the variable resistance element when a voltage is applied to the N type semiconductor so as to flow a current in the direction from the second electrode toward the first electrode.

5. The semiconductor memory device according to claim 1, wherein
the N type semiconductor contacts directly to the first line or the second line, and forms a Schottky barrier between the first line or second line and the second electrode.

6. The semiconductor memory device according to claim 1, wherein
the memory cell further includes a diode, and the second electrode is located toward the diode.

7. The semiconductor memory device according to claim 1, wherein
the second electrode is located toward the first line or the second line.

8. The semiconductor memory device according to claim 1, wherein
the setting operation is an operation for changing the variable resistance element from a high-resistance state to a low-resistance state, and a resetting operation is an operation for changing the variable resistance element from a low-resistance state to a high-resistance state, and a voltage applied to the memory cells during the setting operation and a voltage applied to the memory cells during the resetting operation have reverse polarities to each other.

9. A semiconductor memory device, comprising:
a memory cell array configured having memory cells arranged therein, each of the memory cells being disposed between a first line and a second line and including a variable resistance element; and
a control unit configured to control a voltage applied to the memory cell array,
the memory cell further including:
a first electrode contacting to a first surface of the variable resistance element; and
a second electrode contacting to a second surface of the variable resistance element,
the first electrode being configured by a metal,
the second electrode being configured by a P type semiconductor, and
the control unit being configured to, when performing a setting operation of the memory cells, apply a voltage such that a current flows in a direction from the first electrode toward the second electrode.

10. The semiconductor memory device according to claim 9, wherein
the P type semiconductor is P type polysilicon.

11. The semiconductor memory device according to claim 9, wherein
the P type semiconductor is configured such that a depletion layer is formed between the second electrode and the variable resistance element when a voltage is applied to the P type semiconductor so as to flow a current in the direction from the first electrode toward the second electrode.

12. The semiconductor memory device according to claim 9, wherein
the P type semiconductor is P type poysilicon, and
the P type semiconductor is configured such that a depletion layer is formed between the second electrode and the variable resistance element when a voltage is applied to the P type semiconductor so as to flow a current in the direction from the first electrode toward the second electrode.

13. The semiconductor memory device according to claim 9, wherein
the P type semiconductor contacts directly to the first line or the second line, and forms a Schottky barrier between the first line or second line and the second electrode.

14. The semiconductor memory device according to claim 9, wherein
the memory cell further includes a diode, and the second electrode is located toward the diode.

15. The semiconductor memory device according to claim 9, wherein
the second electrode is located toward the first line or the second line.

16. The semiconductor memory device according to claim 9, further comprising:
an insulating film formed between the second electrode and the variable resistance element and including a Si—N bond.

17. The semiconductor memory device according to claim 16, wherein
the setting operation is an operation for changing the variable resistance element from a high-resistance state to a low-resistance state, and a resetting operation is an operation for changing the variable resistance element from a low-resistance state to a high-resistance state, a forming operation is an operation for rendering the memory cells in a state of being transition-capable between a high-resistance state and a low-resistance state, and the setting voltage has a reverse characteristic to a forming voltage applied during the forming operation.

* * * * *